United States Patent
Wang et al.

(10) Patent No.: US 11,477,059 B2
(45) Date of Patent: Oct. 18, 2022

(54) CIRCUITS AND METHODS FOR DETECTING AND UNLOCKING EDGE-PHASE LOCK

(71) Applicant: Rambus Inc., San Jose, CA (US)

(72) Inventors: Nanyan Wang, Cupertino, CA (US); Marcus van Ierssel, Toronto (CA)

(73) Assignee: Rambus Inc., San Jose, CA (US)

( * ) Notice: Subject to any disclaimer, the term of this patent is extended or adjusted under 35 U.S.C. 154(b) by 0 days.

(21) Appl. No.: 17/532,865

(22) Filed: Nov. 22, 2021

(65) Prior Publication Data

US 2022/0182267 A1 Jun. 9, 2022

Related U.S. Application Data

(60) Provisional application No. 63/123,041, filed on Dec. 9, 2020.

(51) Int. Cl.
| | |
|---|---|
| *H04L 25/49* | (2006.01) |
| *H04L 7/033* | (2006.01) |
| *H04L 27/06* | (2006.01) |
| *H03L 7/08* | (2006.01) |

(52) U.S. Cl.
CPC ........ *H04L 25/4917* (2013.01); *H03L 7/0807* (2013.01); *H04L 7/0337* (2013.01); *H04L 27/06* (2013.01)

(58) Field of Classification Search
CPC ... H04L 25/4917; H04L 7/0337; H04L 27/06; H03L 7/0807
See application file for complete search history.

(56) References Cited

U.S. PATENT DOCUMENTS

| | | | |
|---|---|---|---|
| 7,269,212 B1 | 9/2007 | Chau et al. | |
| 7,308,048 B2 * | 12/2007 | Wei | H04L 7/0337 375/360 |
| 7,336,749 B2 | 2/2008 | Garlepp | |
| 8,594,262 B2 * | 11/2013 | Slezak | H04L 27/0014 375/360 |

(Continued)

OTHER PUBLICATIONS

Tektronix, "PAM4 Signaling in High Speed Serial Technology: Test, Analysis, and Debug—Application Note," 55W-60273-1, Jan. 2016, 28 pages.

(Continued)

*Primary Examiner* — Freshteh N Aghdam
(74) *Attorney, Agent, or Firm* — Silicon Edge Law Group LLP; Arthur J. Behiel

(57) ABSTRACT

A receiver samples an analog, multi-level, pulse-amplitude-modulated signal using a clock-and-data recovery circuit (CDR) that samples the signal against adaptively calibrated symbol-decision thresholds in time with a clock signal that is phased aligned with and locked to the signal. The CDR can erroneously align the clock signal to inter-symbol edges of the signal, a condition called "edge lock," rather than on the symbols themselves. A transition-type detector senses the edge-lock condition and unlocks the CDR, which can then realign the clock signal, this time on the symbols rather than the inter-symbol edges. The receiver can also respond to the edge-lock condition by kick-starting a shift of symbol-decision threshold that helps the CDR settle more quickly on correct symbol-decision thresholds.

20 Claims, 5 Drawing Sheets

(56) References Cited

U.S. PATENT DOCUMENTS

| | | | |
|---|---|---|---|
| 9,036,764 B1 | 5/2015 | Hossain et al. | |
| 9,209,966 B1 | 12/2015 | Hossain et al. | |
| 9,397,868 B1 | 7/2016 | Hossain et al. | |
| 9,768,947 B2 | 9/2017 | Hossain et al. | |
| 10,236,892 B2 | 3/2019 | Moballegh et al. | |
| 10,291,440 B2 | 5/2019 | Farjad-Rad | |
| 10,530,619 B2 | 1/2020 | Palmer | |
| 10,848,298 B1 * | 11/2020 | Mohr | H04L 7/033 |
| 2013/0128943 A1 * | 5/2013 | Doron | H03G 3/002 |
| | | | 375/232 |
| 2013/0322506 A1 | 12/2013 | Zerbe et al. | |
| 2016/0301522 A1 * | 10/2016 | Tetzlaff | H04B 3/462 |
| 2019/0288831 A1 * | 9/2019 | Kobayashi | H04L 7/04 |

OTHER PUBLICATIONS

Lee et al., "Design of 56 GB/s NRZ and PAM4 SerDes Transceivers in CMOS Technologies," IEEE Journal of Solid-State Circuits, vol. 50, No. 9, Sep. 2015, 13 pages.

\* cited by examiner

CIRCUITS AND METHODS FOR DETECTING AND UNLOCKING EDGE-PHASE LOCK

BACKGROUND

Binary communication systems represent information using just two symbols—e.g. relatively high and low voltage levels—to alternatively represent a logic one and a logic zero (i.e. 1b or 0b, where "b" is for binary). The number of voltage levels used to represent digital data is not limited to two, however. For example, a type of signaling referred to as PAM4 (pulse-amplitude modulation, four levels) divides the voltage range over which a signal transitions into four sub-ranges, or levels, each level representing a different combination of two binary bits (i.e., 00b, 01b, 10b, or 11b). A series of two-bit symbols can thus be communicated as a voltage signal that transitions between four levels that represent the symbols. The symbols are of equivalent duration, termed the "unit interval," and are communicated at a symbol rate, or "baud."

Digital receivers categorize each incoming symbol by sampling the signal's voltage during the corresponding unit interval. PAM4 receivers compare each symbol to three symbol-decision thresholds that divide the signal's swing into the four ranges, and thus discover the two-bit value of the symbol. The sample instants are carefully timed to the symbols using edges of a periodic clock signal.

Some receivers include adaptation circuitry that actively calibrates the symbol-decision thresholds and clock-and-data recovery (CDR) circuitry that aligns the clock signal with the phase of incoming signal based on properties of the input signal. In a PAM4 receiver of this type, there is an interplay between adaptation of the symbol-decision thresholds and the clock phase alignment, each requiring time to settle on optimized values. Ideally, the CDR locks sample edges of the clock signal near the symbol centers, a condition referred to herein as "pulse-phase lock" or "pulse lock." Unfortunately, the CDR can mistakenly synchronize the clock signal to the inter-symbol transitions, or "edges," rather than to the symbols themselves. In this condition, called "edge-phase lock" or "edge lock," the CDR samples erroneous data and adaptively settles on the wrong symbol-decision thresholds. A system in calibration can respond to errors by restarting the CDR, which wastes valuable time and is not guaranteed to produce a condition of pulse lock. There is therefore a need for methods and circuits for handling edge lock.

BRIEF DESCRIPTION OF THE FIGURES

The present disclosure is illustrated by way of example, and not by way of limitation, in the figures of the accompanying drawings. For elements with numerical designations the first digit indicates the figure in which the element is introduced, and like references refer to similar elements within and between figures.

DETAILED DESCRIPTION

Figure 1A:
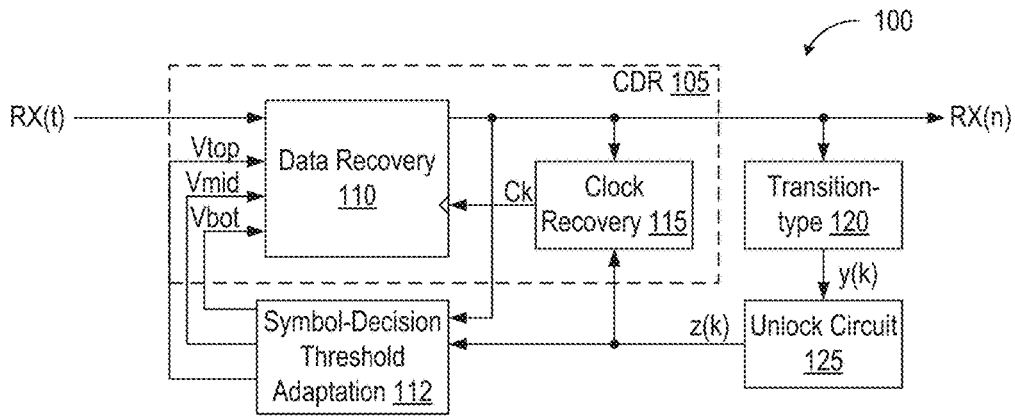
FIG. 1A depicts a receiver 100 for sampling an analog, four-level, pulse-amplitude modulated (PAM4) signal RX(t) with a clock-and-data recovery circuit (CDR 105).

FIG. 1A depicts a receiver 100 for sampling an analog, four-level, pulse-amplitude modulated (PAM4) signal RX(t) with a clock-and-data recovery circuit (CDR 105). CDR 105 can phase lock onto input signal RX(t) in pulse lock or edge lock. In pulse lock, CDR 105 produces a digital output signal RX(n) that accurately represents the input signal. In edge lock, output signal RX(n) is erroneous and exhibit statistically anomalous patterns of symbol transitions. A transition-type detector 120 monitors signal RX(n) for these patterns to sense the edge-lock condition, responsively asserting an edge-lock status signal y(k) to an unlock circuit 125. When signal y(k) indicates edge lock, unlock circuit 125 promptly unlocks CDR 105 by shifting the sample phase nearer to the symbol centers so that CDR 105 can rapidly settle in pulse lock. In some embodiments, unlock circuit 125 also initiates a voltage shift of symbol-decision thresholds that helps CDR 105 settle more quickly on the correct decision thresholds.

CDR 105 includes a data-recovery circuit 110 and a clock-recovery circuit 115. In this PAM4 embodiment, each pulse representing a symbol in signal RX(t) is expressed as a level within one of four ranges. Data-recovery circuit 110 periodically samples signal RX(t) to convert each of those levels into one of four two-bit symbols 00b, 01b, 10b, and 11b, the 'b' for "binary." Clock recovery circuit 115 extracts a clock signal Ck from signal RX(n) and a symbol-decision adaptation circuit 112 settles on three thresholds Vtop, Vmid, and Vbot that separate the voltage range of signal RX(t) into the four levels, or sub-ranges. Data-recovery circuit 110 samples each incoming symbol with respect to the three symbol-decision thresholds in time to edges of clock signal Ck to produce a digital stream RX(n) of two-bit binary numbers.

Symbols expressed on input signal RX(t) transition regularly between levels during operation. In pulse lock, the types of transitions expressed in digital stream RX(n) thus tend to be evenly distributed. Due to sample errors characteristic of edge lock, however, some types of symbol transitions are relatively numerous or scarce in digital stream RX(n) when CDR 105 is in edge lock. Detector 120 asserts edge-lock status signal y(k) responsive to a statistically anomalous pattern or patterns consistent with edge lock. Unlock circuit 125 asserts unlock signal z(k) to cause clock-recovery circuit 115 to offset the phase of clock signal Ck away from a condition of edge lock and closer to a position of pulse lock, a phase offset of a half unit interval for example. Clock-recovery circuit 115 thereafter requires phase lock with input signal RX(n), this time likely in pulse lock rather than edge lock. Unlock signal z(k) also nudges threshold-adaptation circuit 112 toward threshold voltages closer to those appropriate for pulse lock, and thus reduces the time required for threshold re-training.

Figure 1B:
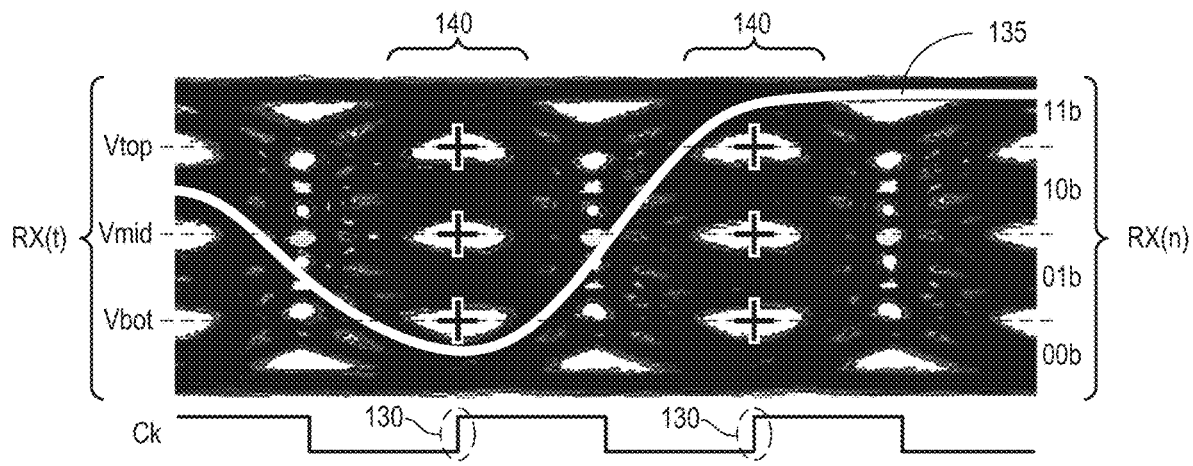
FIG. 1B depicts a PAM4 eye diagram of signal RX(t) in pulse lock with rising edges of clock signal Ck and symbol-decision thresholds Vbot, Vmid, and Vtop properly calibrated.

FIG. 1B depicts a PAM4 eye diagram of signal RX(t) in pulse lock with rising edges of clock signal Ck and symbol-decision thresholds Vbot, Vmid, and Vtop properly calibrated. An eye diagram is an overlay of signal traces of many instances of each transition type, wherein the "eyes" encompass sample points and their areas (openings in voltage and time) represent margins of error. The left vertical axis divides a voltage range into four regions via the symbol-decision thresholds; the right vertical axis shows the discrete binary values of signal RX(n) associated with each of the four voltage regions. The horizontal axis represents time with rising edges 130 of clock signal Ck serving as reference. Plus signs (+) represent sample points in time and voltage, each taking place at the intersection of a symbol-decision threshold and rising clock edge 130. Falling edges are ignored but can be used instead of or in addition to rising edges in other embodiments.

The voltage level of signal RX(t) should fall within one of the four ranges separated by symbol-decision thresholds Vbot, Vmid, and Vtop at each rising edge 130 of clock signal Ck and can transition from any such range to any other between rising edges. As used herein, a "transition" is between unit intervals; a transition does not require a change in symbol values from one unit interval to the next (e.g., the signal's voltage can remain between voltages Vbot and Vmid for two symbol times to express successive values of 01b, or 0101b). Signal RX(t) can thus transition from any of four levels to any of the four levels, for a total of sixteen possible types of transition. FIG. 1B depicts a bold, white line 135 that represents a signal that transitions from the lowest pulse amplitude (below Vbot) to the highest pulse amplitude (above Vtop) between constitutive eyes 140 timed to the rising clock edges 130.

Figure 1C:
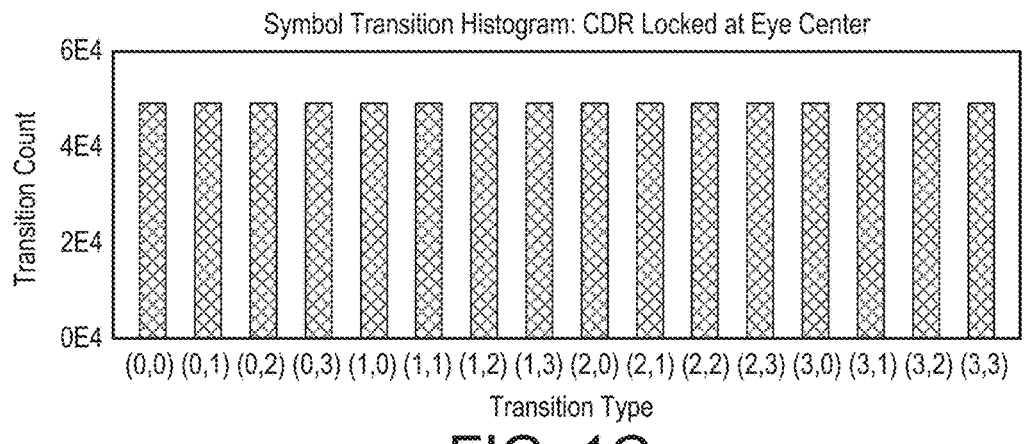
FIG. 1C is a symbol transition histogram of two consecutive symbols recovered from signal RX(t), reflecting the condition in which receiver 100 is pulse locked—rising edges 130 centered within the symbol eyes—and symbol-decision thresholds Vtop, Vmid, and Vbot are calibrated.

FIG. 1C is a symbol transition histogram of two consecutive symbols recovered from signal RX(t), reflecting the condition in which receiver 100 is pulse locked—rising edges 130 centered within the symbol eyes—and symbol-decision thresholds Vtop, Vmid, and Vbot are calibrated. Sample transitions for random data tend to be evenly distributed for large numbers. In this example, each of the sixteen PAM4 symbol transition types has about fifty thousand (5E4) instances after about eight hundred thousand symbol transitions. Transition types are here labeled using decimal numbers (e.g. 0,3 denotes a transition from RX(n)= 00b to 11b). Transition-type detector 120, monitoring one or more of these patterns, can sense that receiver 100 is in a condition of pulse lock. Other patterns (e.g., of three consecutive symbols) can also be monitored.

Figure 2A:
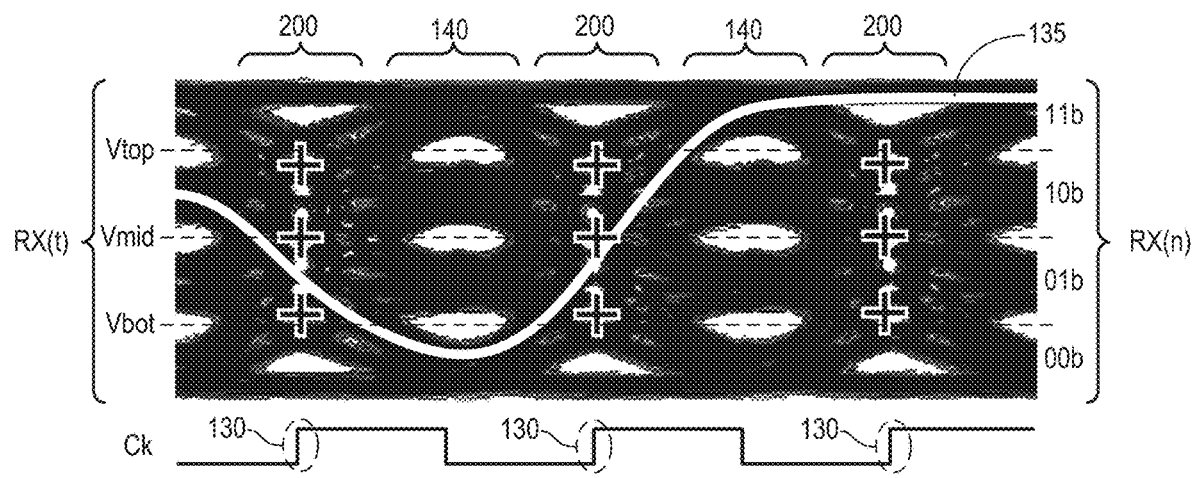
FIG. 2A depicts the same PAM4 eye diagram of signal RX(t) from FIG. 1B but in edge lock with rising edges 130 of clock signal Ck locked to eye-like gaps 200 between the symbols rather than on eyes 140.

FIG. 2A depicts the same PAM4 eye diagram of signal RX(t) from FIG. 1B but in edge lock with rising edges 130 of clock signal Ck locked to eye-like gaps 200 between the symbols rather than on eyes 140. Eye-like gaps 200 are depicted as appreciably smaller than eyes 140; while this should be true for a calibrated receiver, the relative sizes can differ dramatically before calibration is complete. The left vertical axis remains divided into four regions via symbol-decision thresholds Vbot, Vmid, and Vtop; however, the sample points denoted by plus signs (+) show that CDR 105 is locked to the eye-like gaps 200 that appear between symbol times. Further, the bottom and top symbol-decision thresholds settled on by threshold-adaptation circuit 112 are off relative to the correct symbol-decision thresholds Vbot and Vtop. In essence, CDR 105 has been tricked into finding and locking to sample points between symbols, the edge-lock condition that results in erroneous sample interpretations. Assuming clock signal Ck is advanced relative to signal RX(t), the bold, white line 135 introduced in FIG. 1B as representing a signal that transitions from 00b to 11b between the eyes rising clock edges 130 will instead be erroneously perceived as transitioning from 01b to 01b between the first two edges 130. If clock signal Ck were retarded relative to signal RX(t), line 135 will instead be erroneously perceived as transitioning from 01b to 01b between the second and third rising edges 130.

Figure 2B:
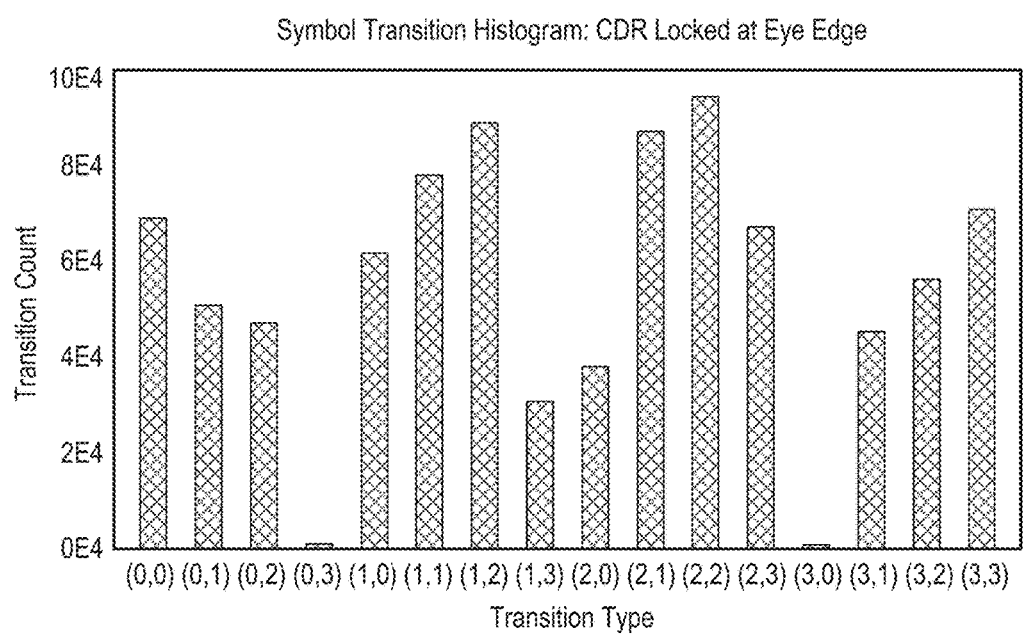
FIG. 2B is a symbol transition histogram of two consecutive symbols recovered from signal RX(t), reflecting the condition in which receiver 100 is edge locked in the manner depicted in FIG. 2A.

FIG. 2B is a symbol transition histogram of two consecutive symbols recovered from signal RX(t), reflecting the condition in which receiver 100 is edge locked in the manner depicted in FIG. 2A. Sampling random symbols using edge timing produces unevenly distributed transition types. Transitions associated with large inter-symbol voltage changes tend to be rare relative to those associated with minor changes. Of the sixteen PAM4 symbol transition types in this example, those that represent extreme voltage transitions—between highest and lowest levels (0,3 or 3,0)—are nearly absent, whereas those that represent minimal voltage transitions—between adjacent levels (e.g. 1,2 or 2,2)—are common.

Returning to FIG. 1, transition-type detector 120 monitors the prevalence of one or more transition types, either with respect to time or relative to one another, to sense an edge lock condition. Unlock circuit 125, responsive to edge lock, inspires clock-recovery circuit 115 to unlock clock signal Ck from signal RX(t) and shift rising edged 130 toward the centers of eyes 140, about half a unit interval in this example. Unlock circuit 125 also causes threshold-adaptation circuit 112 to shift the upper and lower threshold voltages settled on in edge lock closer to the correct values. CDR 105 is thereafter able to reacquire phase lock, this time in alignment with the incoming pulses, and quickly adapt to the correct symbol-decision thresholds.

Figure 3:
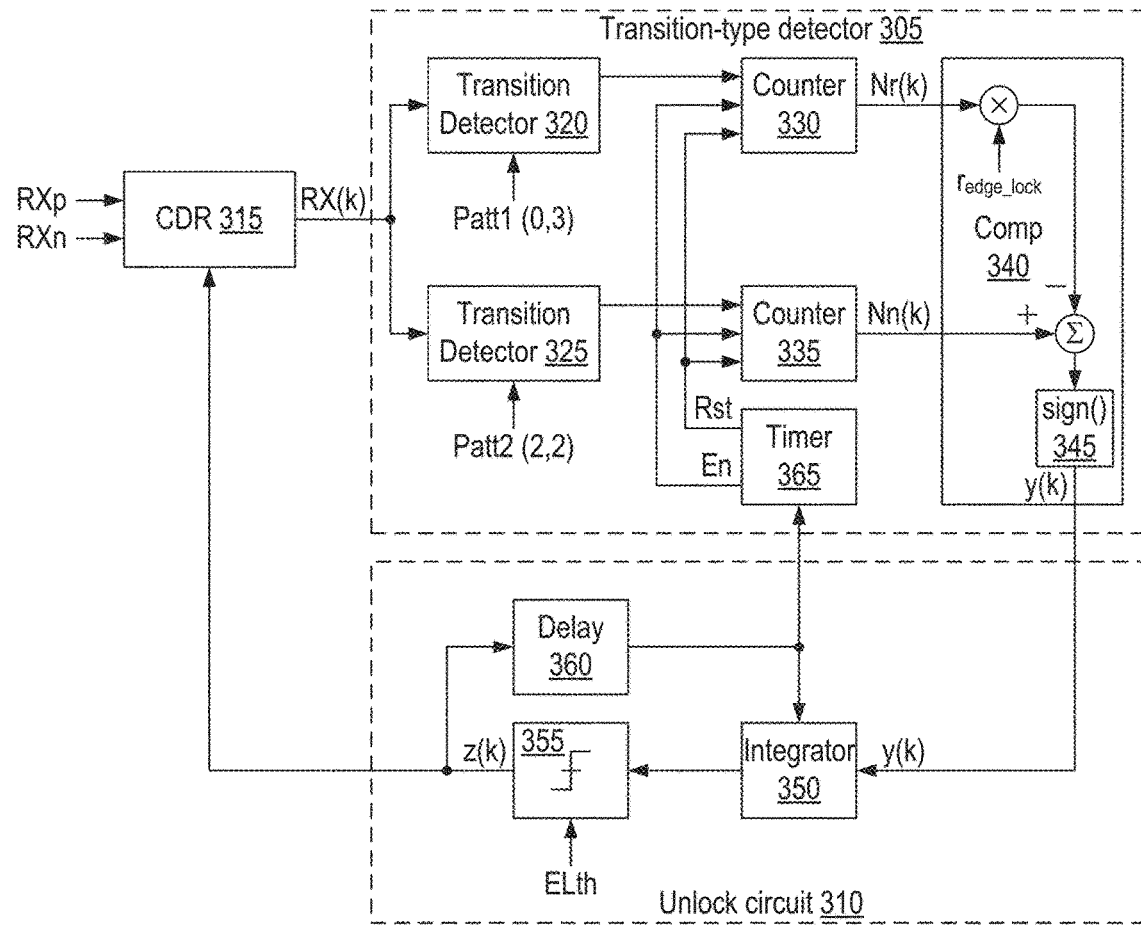
FIG. 3 depicts a receiver 300 in which a transition-type detector 305 and unlock circuit 310 in accordance with one embodiment detect and unlock edge-phase alignment in a CDR 315.

FIG. 3 depicts a receiver 300 in which a transition-type detector 305 and unlock circuit 310 in accordance with one embodiment detect and unlock edge-phase alignment in a CDR 315. Input signal RXp/RXn, differential in this example, is sampled by CDR 315 to produce a digital output stream RX(n) as in the example of FIG. 1. A pair of transition detectors 320 and 325, one to detect a pattern Patt1 that is relatively rare in edge lock (e.g. 0,3) and one to detect a pattern Patt2 that is relatively numerous in edge lock (e.g. 2,2). A corresponding pair of counters 330 and 335 accumulate the number of transitions detected by respective transition detectors 320 and 325 to accumulate counts Nr(k) and Nn(k) for rare and numerous transition types, respectively. Referring back to the histogram of FIG. 2B, patterns Patt1 and Patt2 correspond to transitions (0,3) and (2,2), which accumulate at dramatically different rates in edge lock. The contents of counters 330 and 335 can thus be compared to sense edge lock.

Returning to FIG. 3, a comparison circuit 340 multiplies count Nr(k) by a factor $r_{edge\_lock}$. The factor $r_{edge\_lock}$ is selected based on the ratio between the number of numerous transition type and the number of rare transition types at edge-lock condition so that its product with Nr(k) can be compared to Nn(k) for the provisional detection of edge-lock status. The product is then subtracted from value Nn(k) and the difference provided to a sign element 345 that issues a binary, provisional edge-lock status signal y(k) that is negative for pulse lock and positive for edge lock. An integrator 350 integrates signal y(k) over some number of cycles to provide low-pass filtering. An edge-lock detector 355 asserts edge-lock detection signal z(k) if the output from integrator 350 exceeds an edge-lock threshold ELth, which kicks CDR 315 out of edge lock. A delay element 360 feeds signal z(k) back to reset integrator 350 and a timer 365, the latter of which resets and enables counter 330 and 335 to begin counting anew as CDR 315 attempts to reestablish phase lock.

Figure 4:
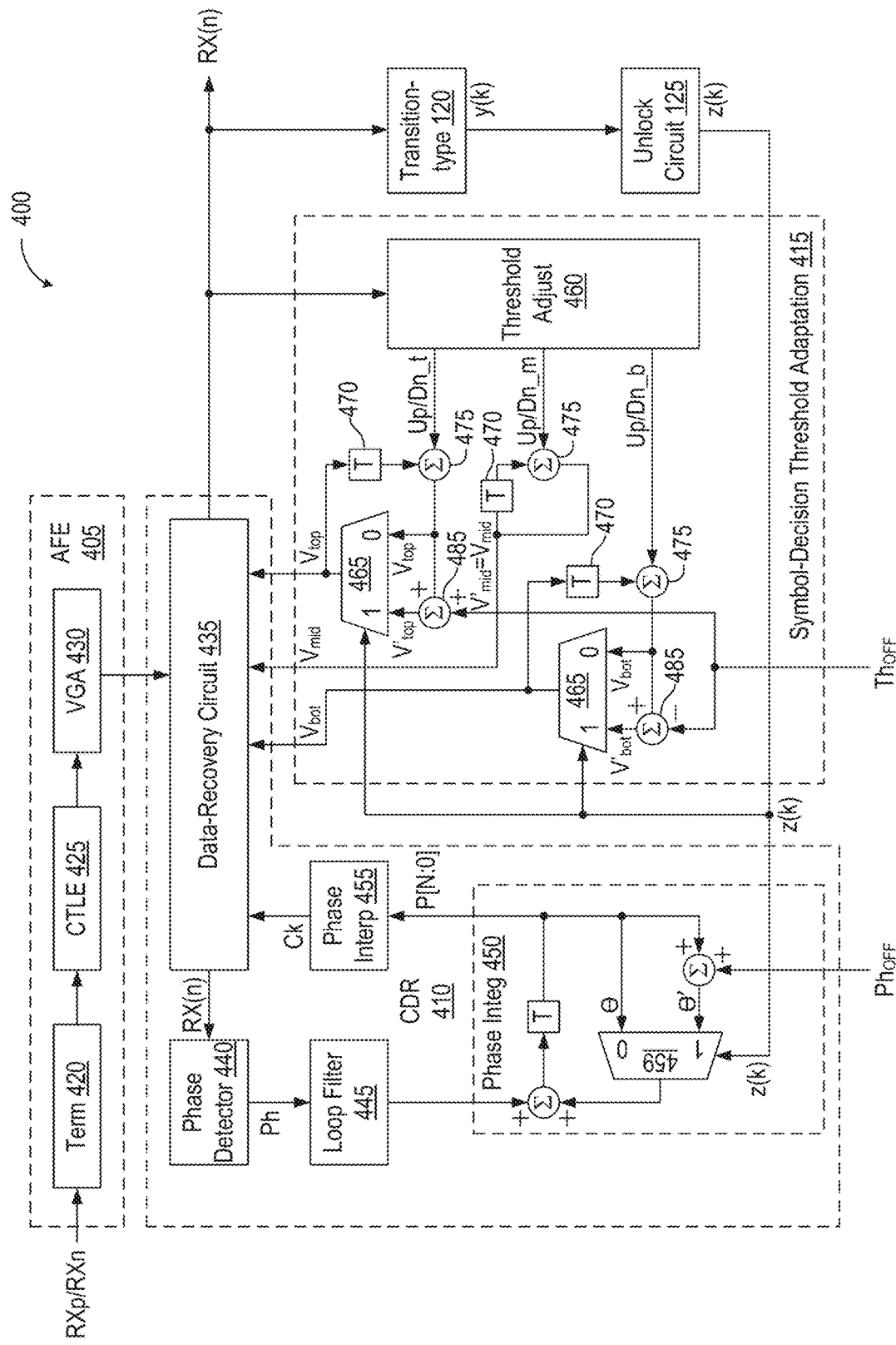
FIG. 4 depicts a receiver 400 in which an analog front end (AFE) 405 conditions an input signal RXp/RXn for application to a CDR 410 that produces samples RX(n) in time to a recovered clock signal Ck by comparison to three threshold voltages Vtop, Vmid, and Vbot.

FIG. 4 depicts a receiver 400 in which an analog front end (AFE) 405 conditions an input signal RXp/RXn for application to a CDR 410 that produces samples RX(n) in time to a recovered clock signal Ck by comparison to three threshold voltages Vtop, Vmid, and Vbot. Transition-type detector 120 and unlock circuit 125, embodiments of which are detailed previously, issue edge-detection signal z(k) to CDR 410 and threshold adaptation circuitry 415. When edge lock is detected, signal z(k) causes CDR 410 to introduce a phase offset $Ph_{OFF}$ to clock signal Ck, unlocking the CDR, and causes threshold adaptation circuitry 415 to introduce a threshold offset $Tho_{FF}$ that raises upper threshold voltage Vtop and lowers (more negative) lower threshold voltage Vbot so that they more closely approximate the correct values for a pulse-lock condition. Threshold voltage Vmid is unchanged in this embodiment. CDR 410 and symbol-decision threshold adaptation circuitry 415 are thus able to recalibrate with correct phase and threshold alignment.

AFE 405 includes termination elements 420 that match the impedance of receiver 400 with the incoming channel, a continuous-time linear equalizer 425 to reduce channel-induced distortion, and a variable-gain amplifier 430 to adjust the amplitude of the equalized signal to a level optimized for a three-level data-recovery circuit 435. The elements of AFE 405 are well known to those of skill in the art so a detailed discussion is omitted.

Data-recovery circuit 435 includes three data samplers (not shown), one for each threshold voltage, and logic to decode the outputs of those samplers and issue a serial or parallel two-bit symbol for each pulse of signal RXp/RXn. In other embodiments, data-recovery circuit 435 includes e.g. an analog-to-digital converter (ADC), digital equalizers to equalize the digital signal from the ADC, and symbol-decision circuitry to issue the recovered symbols from the equalized digital signal. For ADC-based PAM-N receiver, the ADC includes more than N−1 samplers and the sampler thresholds are different from the N−1 symbol-decision thresholds. The N−1 thresholds are used to make symbol decision from digital equalized signal.

A phase detector 440 produces a phase-error signal Ph responsive to a phase difference between a recovered clock signal Ck and a sampled output from data-recovery circuit 435 (here illustrated as signal RX(n)). A loop filter 445 filters the phase-error signal to control a phase integrator 450, which produces N+1 clock phases P[N:0] for input to a phase interpolator 455 that mixes phases P[N:0] to produce receive clock signal CK. Phase integrator 450 includes a multiplexer 459 that induces a half unit interval of phase offset in clock phases P[N;0], and therefore clock signal Ck, when unlock signal z(k) is asserted.

Threshold adaptation circuitry 415 includes a threshold-adjustment circuit 460 that increments/decrements signals Up/Dn_t, Up/Dn_m, and Up/Dn_b responsive to sample errors, which can be detected using e.g. edge and data samplers that are well known and thus not shown. Assuming signal z(k) is zero, indicative of pulse lock, a pair of multiplexers 465 with state storage 470 and a summing circuit 475 accumulate signals Up/Dn_t and Up/Dn_b to settle on calibrated values of threshold voltages Vtop and Vbot, respectively. A third summing circuit 475 and state storage 470 likewise accumulate signals Up/Dn_m to settle on a calibrated value of middle threshold voltage Vmid that separates the two middle pulse amplitudes. The calculations of circuitry 415 can be done digitally, in which case the threshold voltages can be applied to Data-recovery circuit 435 via digital-to-analog converters (DACs), not shown. These aspects of PAM4 samplers and threshold adaptation are well known.

When signal z(k) is asserted to initiate unlocking from edge lock, a voltage offset $Th_{OFF}$ applies to a pair of summing amplifiers 485. The voltage offset is subtracted from threshold voltage Vbot and added to threshold voltage Vtop, thereby producing a pair of offset threshold voltages V'bot and V'top for presentation to data-recovery circuit 435. With reference to FIG. 2A, the upper and lower eye-like gaps 200 are respectively below and above the correct values for the upper and lower eyes 140. Voltage offset $Tho_{FF}$ is selected to approximate the voltage difference between the upper and lower eye-like gaps and the corresponding eyes, and thus to set data-recovery circuit 435 near the correct values. Nudging the threshold voltages toward their correct values expedites the training required for receiver 400 to settle on the correct values. Signal z(k) also causes multiplexer 459 to add a phase offset $Pho_{FF}$ to the phase signal Θ fed back by integrator 450, thus instigating a phase offset in clock signal Ck. Voltage offset $Tho_{FF}$ and phase offset $Ph_{OFF}$ can be digital values loaded into a register during receiver initialization.

Figure 5:
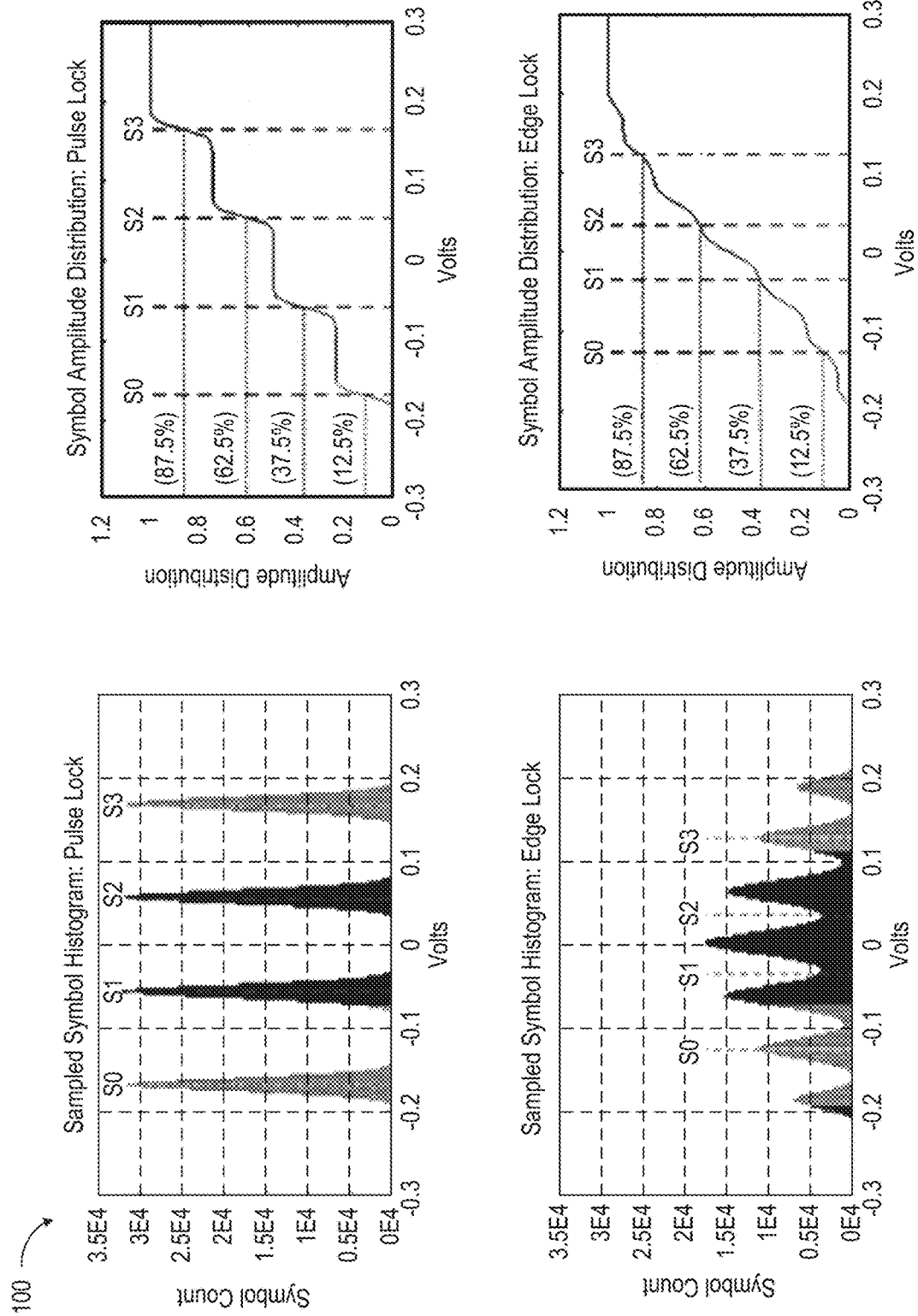
FIG. 5 includes symbol histograms and symbol amplitude distributions for pulse-lock and edge-lock conditions.

FIG. 5 includes symbol histograms and symbol amplitude distributions for pulse-lock and edge-lock conditions. In pulse lock, the four symbols values S0-S3 for a PAM4 receiver are relatively tightly grouped and of respective and discrete amplitudes, as illustrated in the top two plots. In contrast, edge lock is characterized by symbol amplitudes that are much less discrete. The adapted sampler thresholds at edge phase are of lower magnitude than their values at eye center. Threshold adaptation circuitry 415 therefore pushes the sampler thresholds adapted at edge phase towards to their values at eye center. This action breaks the correlative dependence and interplay between CDR 410 and threshold adaptation circuitry 415. Updating the sampler thresholds improves the CDR phase-error detection and thus expedites pulse locking.

While the subject matter has been described in connection with specific embodiments, other embodiments are also envisioned. For example, a receiver can unlock a CDR by advancing or retarding the PAM signal in lieu of or in addition to the clock signal. Edge-lock detection can be extended to applications that represent signals using numbers of levels other than four. As in the PAM4 examples above, the number of transitions between the symbols with minimum transmit amplitude and symbols with maximum transmit amplitude are reduced for receivers with higher values of N when the CDR locks to edge, whereas the number of symbol transitions between the two symbols with transmit amplitude near zero volts is increased. For example, in a PAM5 receiver the number of 0/4 transitions are significantly fewer than those for e.g. 2/2, 1/2, and 2/3; and in a PAM6 receiver the number of 0/5 transitions are significantly fewer than those for e.g. 2/3, 2/2, and 3/3. Moreover, the unlock circuitry can be used for PAM-N (N>2). Similar as PAM4, the CDR phase can be offset by a half unit interval upon the detection of edge-lock status. For PAM-N, there are N−1 symbol-decision thresholds for the detection of N symbols, 0/1/2/ . . . /N−1. Upon the detection of edge-lock status, the symbol-decision thresholds can be offset outwards to help the receiver to get out of edge-lock status. For example, in a PAM5 receiver with two negative thresholds V0 and V1 and two positive thresholds V2 and V3, upon detection of edge lock a negative offset is applied to thresholds V0 and V1 and a positive offset to thresholds V2 and V3. In a PAM6 receiver with five symbol-decision thresholds, the center at zero volts, the negative thresholds are treated to a negative offset and the positive thresholds to a positive offset. Therefore, the spirit and scope of the appended claims should not be limited to the foregoing description. Only those claims specifically reciting "means for" or "step for" should be construed in the manner required under the sixth paragraph of 35 U.S.C. § 112.

What is claimed is:

1. A receiver for sampling pulses of a pulse-amplitude-modulated (PAM) signal in which each pulse encodes at least two bits of information, the receiver comprising:
   a data-recovery circuit to receive the PAM signal, a clock node to receive a timing-reference signal, and an output, the data-recovery circuit to sample the pulses responsive to the timing-reference signal and issue the samples of the pulses on the output;
   a clock-recovery circuit coupled to the clock node and the output, the clock-recovery circuit to phase lock the timing-reference signal with the PAM signal, the phase lock including a pulse lock in which the timing-reference signal is phase locked to the pulses and an edge lock in which the timing-reference signal is phase locked between the pulses;
   a transition-type detector coupled to the sampler, the transition-type detector to measure a prevalence of at least one type of transition type between symbols; and
   an unlock circuit coupled to the transition-type detector and the clock-recovery circuit, the unlock circuit to detect the edge lock responsive to the prevalence of the at least one type of transition and, responsive to the edge lock, unlock the clock-recovery circuit.

2. The receiver of claim 1, the transition-type detector detecting the prevalence of a first of the transition types relative to a second of the transition types.

3. The receiver of claim 2, wherein the PAM signal exhibits pulses of a highest level and a lowest level, and wherein the first of the transition types is between the highest level and the lowest level.

4. The receiver of claim 3, wherein the PAM signal exhibits pulses of adjacent levels, and wherein the second of the transition types is between the adjacent levels.

5. The receiver of claim 4, wherein the PAM signal is a PAM4 signal.

6. The receiver of claim 1, wherein the unlock circuit, responsive to the edge lock, applies a phase offset to the timing-reference signal.

7. The receiver of claim 1, the sampler further including voltage-reference nodes to receive respective symbol-decision thresholds against which to compare the pulses, the receiver further comprising a symbol-decision threshold adaptation circuit to adjust at least one of the symbol-decision thresholds responsive to the edge lock.

8. The receiver of claim 7, wherein the symbol-decision threshold adaptation circuit, responsive to the edge lock, applies a voltage offset to the at least one of the symbol-decision thresholds.

9. The receiver of claim 1, wherein the at least one transition type is between adjacent one of the symbols.

10. A method of sampling a pulse-amplitude-modulated (PAM) signal with edges of a clock signal, the PAM signal comprising a sequence of symbols of N>2 symbol values, the method comprises:
    sampling each of the symbols with respect to symbol-decision thresholds to obtain a sequence of samples, the samples periodically transitioning between ones of the N>2 symbol values to produce a series of symbol transitions of different transition types;
    measuring a prevalence of at least one of the different transition types;
    detecting, from the prevalence, an edge-lock condition in which the clock signal is phase locked to the symbol transitions; and
    responsive to the edge-lock condition, phase adjusting at least one of the PAM signal and the clock signal to align the symbols with the edges of the clock signal.

11. The method of claim 10, wherein measuring the prevalence comprises comparing a first count of a first of the transition types with a second count of a second of the transition types.

12. The method of claim 11, wherein the PAM signal has a pair of extreme pulse amplitudes, and wherein the first of the transition types is between the extreme pulse amplitudes.

13. The method of claim 12, wherein the PAM signal has a pair of middle pulse amplitudes, and wherein the second of the transition types is between the middle pulse amplitudes.

14. The method of claim 10, further comprising, responsive to the edge-lock condition, applying a voltage offset to at least one of the symbol-decision thresholds.

15. A receiver for sampling a series of pulses of a pulse-amplitude-modulated (PAM) signal in which each pulse encodes a symbol representing at least two bits of information, the receiver comprising:
    a sampler to issue the samples of the pulses;
    a transition-type detector coupled to the sampler, the transition-type detector to measure a prevalence of at least one type of transition between the pulses; and
    a symbol-decision threshold adaptation circuit to adjust at least one of the symbol-decision thresholds responsive to the prevalence of the at least one type of transition.

16. The receiver of claim 15, further comprising:
    a clock-recovery circuit coupled to the sampler to phase lock a timing-reference signal with the PAM signal, the phase lock including a pulse lock in which the timing-reference signal is phase locked to the pulses and an edge lock in which the timing-reference signal is phase locked between the pulses; and
    an unlock circuit coupled to the clock-recovery circuit and the transition-type detector to unlock the clock-recovery circuit from the edge lock responsive to the prevalence of the at least one type of transition.

17. The receiver of claim 15, the transition-type detector detecting the prevalence of a first of the types of transition relative to a second of the types of transition.

18. The receiver of claim 17, wherein the PAM signal has a pair of extreme pulse amplitudes, and wherein the first of the types of transition is between the extreme pulse amplitudes.

19. The receiver of claim 18, wherein the PAM signal has a pair of middle pulse amplitudes, and wherein the second of the types of transition is between the middle pulse amplitudes.

20. The receiver of claim 15, wherein the at least one transition type is between adjacent one of the symbols.

* * * * *